TRANSISTOR LEAD RIPPLER AND STRAIGHTENER

Filed Oct. 6, 1964 5 Sheets-Sheet 1

INVENTOR
ALBERT W. ZEMEK

BY Fidelman and Wolffe

ATTORNEYS

Oct. 3, 1967 A. W. ZEMEK 3,344,816

TRANSISTOR LEAD RIPPLER AND STRAIGHTENER

Filed Oct. 6, 1964 5 Sheets-Sheet 2

INVENTOR
ALBERT W. ZEMEK

BY Fidelman and Wolffe

ATTORNEYS

Oct. 3, 1967 A. W. ZEMEK 3,344,816

TRANSISTOR LEAD RIPPLER AND STRAIGHTENER

Filed Oct. 6, 1964 5 Sheets-Sheet 3

INVENTOR
ALBERT W. ZEMEK

BY Fidelman and Wolffe

ATTORNEYS

Oct. 3, 1967 A. W. ZEMEK 3,344,816

TRANSISTOR LEAD RIPPLER AND STRAIGHTENER

Filed Oct. 6, 1964 5 Sheets-Sheet 4

INVENTOR
ALBERT W. ZEMEK
BY Fidelman and Wolffe
ATTORNEYS

TRANSISTOR LEAD RIPPLER AND STRAIGHTENER

Filed Oct. 6, 1964 5 Sheets-Sheet 5

INVENTOR
ALBERT W. ZEMEK
BY Fidelman and Wolffe
ATTORNEYS

United States Patent Office 3,344,816

Patented Oct. 3, 1967

3,344,816

TRANSISTOR LEAD RIPPLER AND STRAIGHTENER

Albert W. Zemek, Binghamton, N.Y., assignor to Universal Instruments Corporation, Binghamton, N.Y., a corporation of New York Filed Oct. 6, 1964, Ser. No. 401,857
19 Claims. (Cl. 140—147)

The present invention relates to machines for processing electrical components, particularly components each having a body section with two or more leads extending from one face thereof. More specifically this invention relates to a machine for aligning the leads of components by straightening or deforming and straightening techniques. Specifically this invention relates to a device for applying a predetermined ripple pattern to leads of a multi-lead transistor and restraightening the thus rippled leads.

Electrical components, such as transistors, are commonly mass-produced and packaged by the manufacturer, in lots of ten to several hundred, on long rolled tapes which may be loaded directly into automatic insertion machines for inserting each component separately into a circuit and clinching the leads thereof in place. Although a large number of insertion machines are now in use for the automatic insertion of axial lead components, the intrinsic problems associated with processing of parallel lead transistors, especially where long leads are needed, has held up the production of transistor insertion machines, in large numbers, which are suitable for use in production lines. Previous machines in this specialized field produced so many rejections of the boards at the test station, that the machines were not economically feasible for most uses. Furthermore these machines would be prohibitively expensive in most cases even if they provided more satisfactory results.

The rejects fall into two groups, those in which one or more leads of component did not pass through its associated hole in the board and instead abutted the board face and buckled, and those in which the leads were successfully inserted through the board but did not stay flat against the bottom of the boards after the crimping operation and during the dip soldering operation. The reason for both types of malfunctions is that the leads of the components tend to bend or curve even after combing and straightening operations. It is believed that the curvature of the leads originates in part from the residual deformation remaining in the wire from when it was coiled on a roll before being fabricated into component leads or bends and kinks in the wire leads that are formed by handling between the component fabrication and board assembly stages.

Residual coil curvature has, in the past, been removed in large diameter wires, cables, and plates by running the strip or rod material through a leveller which consists of a number of pairs of offset rolls for continuously flexing the material in alternate directions as it passes through. Even if such a process were adaptable to as thin wire as is used in electrical components it is doubtful if this process could remove the slight set that creates the problem here.

These problems, which also plague the developers of automatic, axial lead component inserters, are magnified in parallel lead component inserters. Since the parallel lead components average more leads apiece and therefore more leads to be inserted into the board in a given area, the holes in the board must be smaller and closer together, necessitating very straight leads as there can be very small tolerances between the diameters of the leads and those of the holes in the board. Microminiturization of all types of electrical components has further complicated matters.

The straightening of axial lead components is a relatively simple matter as there is only one lead at a time to be processed and extensive lead combing operations can often be omitted. When dealing with parallel lead components, the leads must be carefully combed since two, three or more leads lie adjacent each other and if the leads are not positioned correctly when the straightening dies are driven sharply together, the leads become mangled and the component must be rejected. Furthermore, the straightening dies of lead straightening devices for parallel lead components must be rather complicated when considered in relation to axial lead straightening dies, since with parallel lead components, the leads are not usually even in the same plane.

It is a general object of the present invention to provide a lead straightening device that will meet all of the above desiderata.

A more specific object of the present invention is to provide a machine which, in one operation will comb and straighten the leads of parallel lead electrical components even though the leads do not fall within the same plane.

Another object of the present invention is to provide a method for removing the residual curvature or set in the leads of an electrical component.

A further object of the present invention is to provide a machine for rippling and straightening the leads of an electrical component.

Other objects and the nature and advantages of the present invention will be apparent from the following description when taken in conjunction with the accompanying drawings, wherein.

Figures 2, 8, 9, 10:
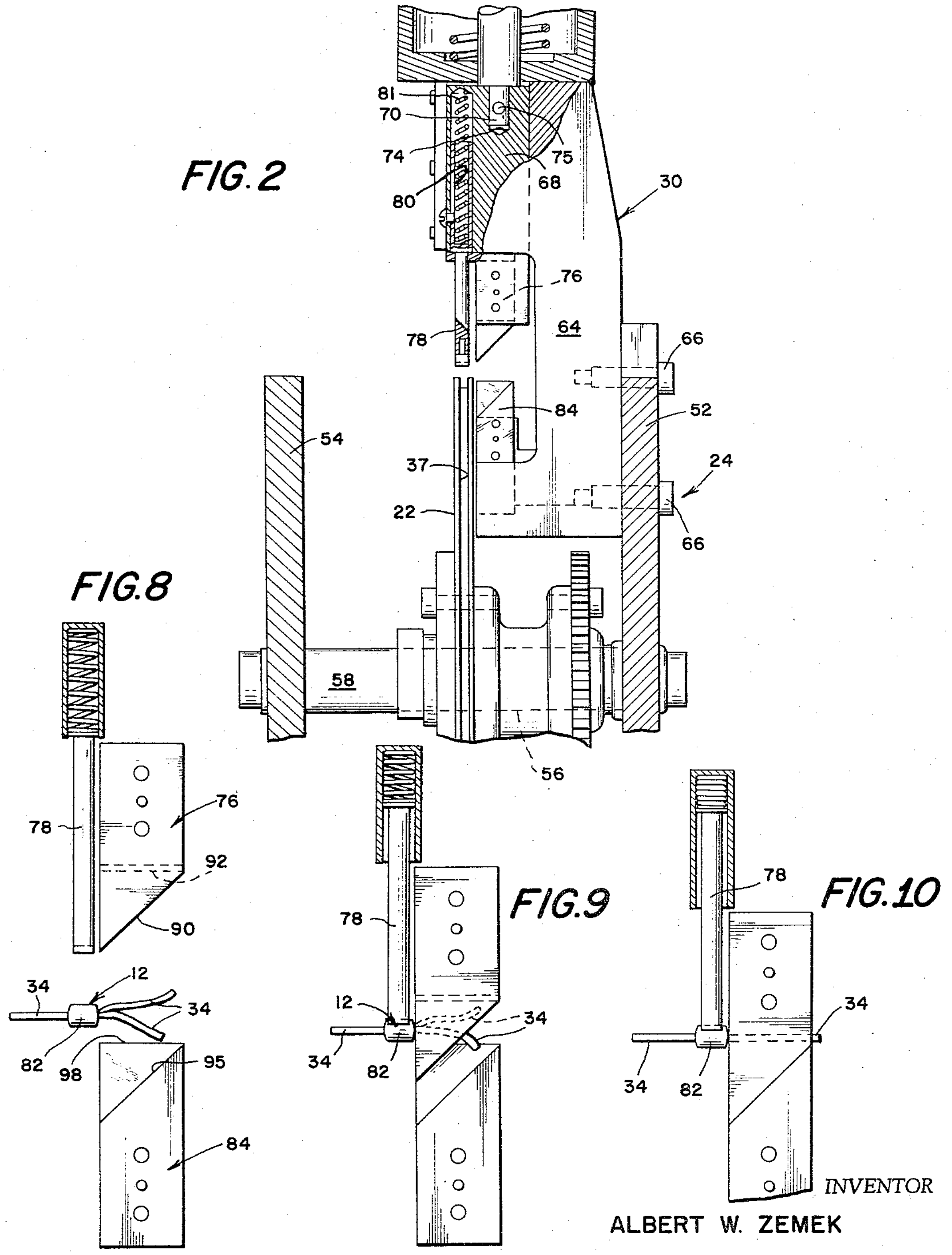
FIG. 2 is a sectional view taken along line 2—2 of FIG. 1 showing a lead combing and processing device of the invention.
Figures 3, 4, 5, 6, 7:
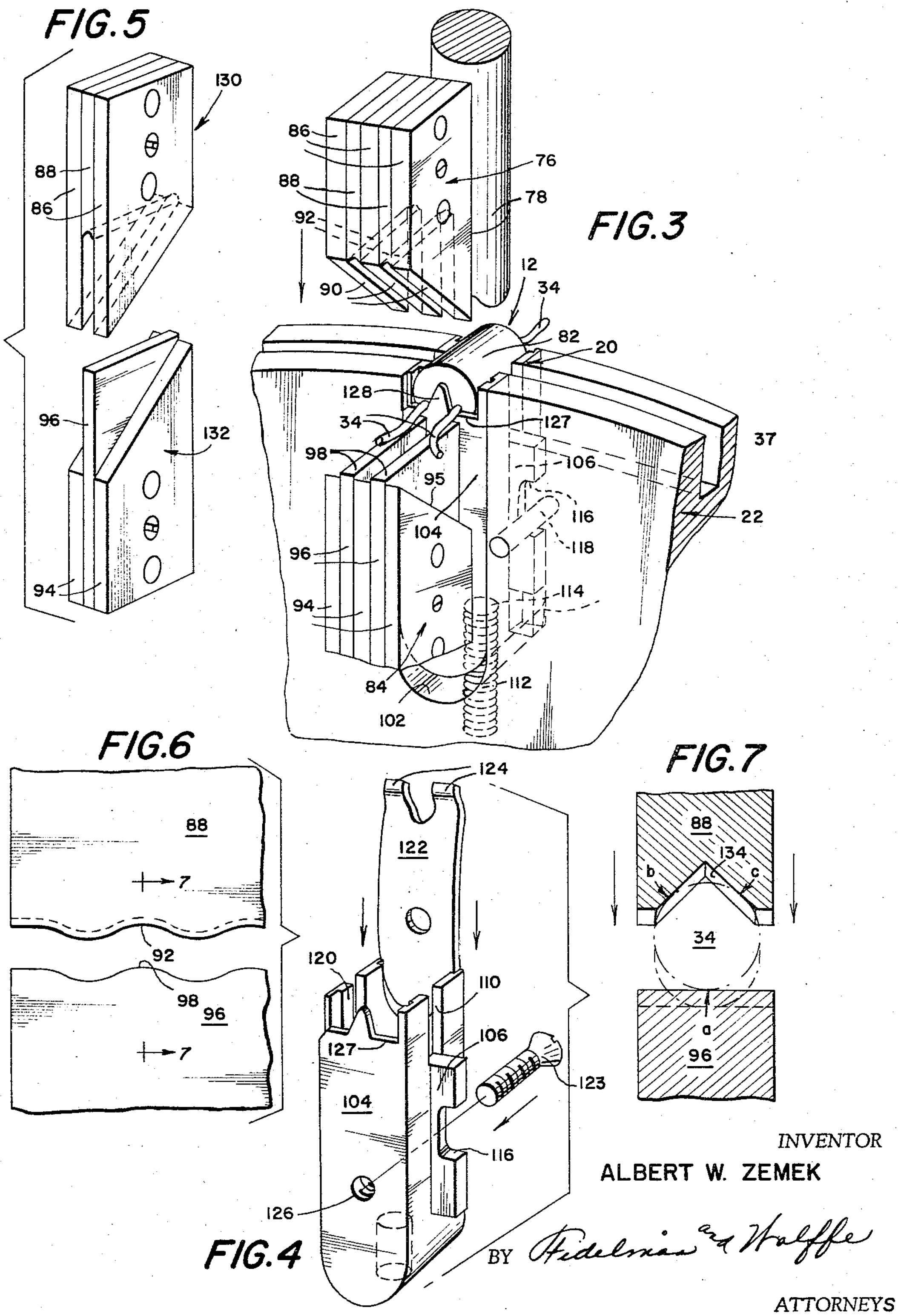
Figures 11, 12:
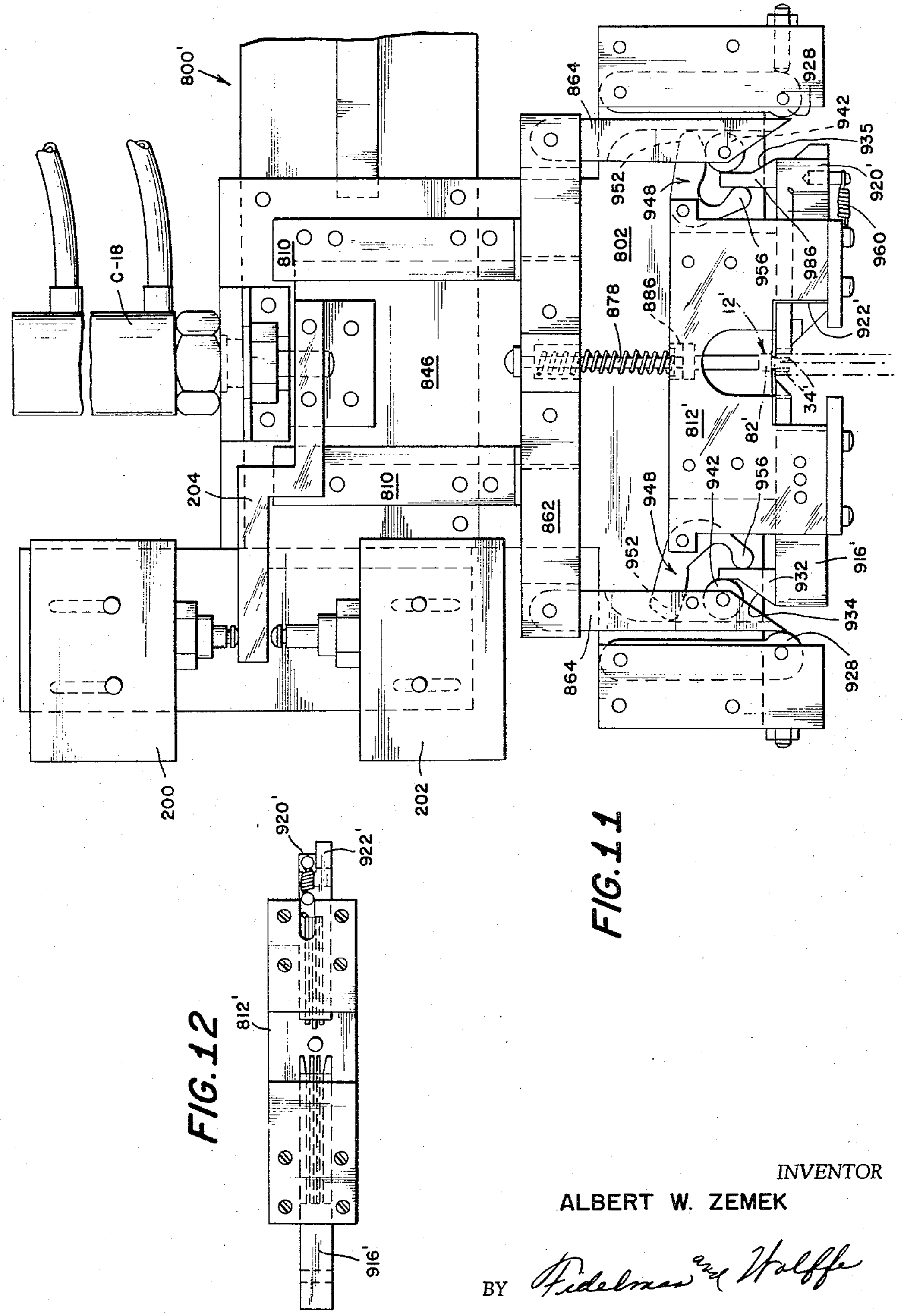
Figure 13:
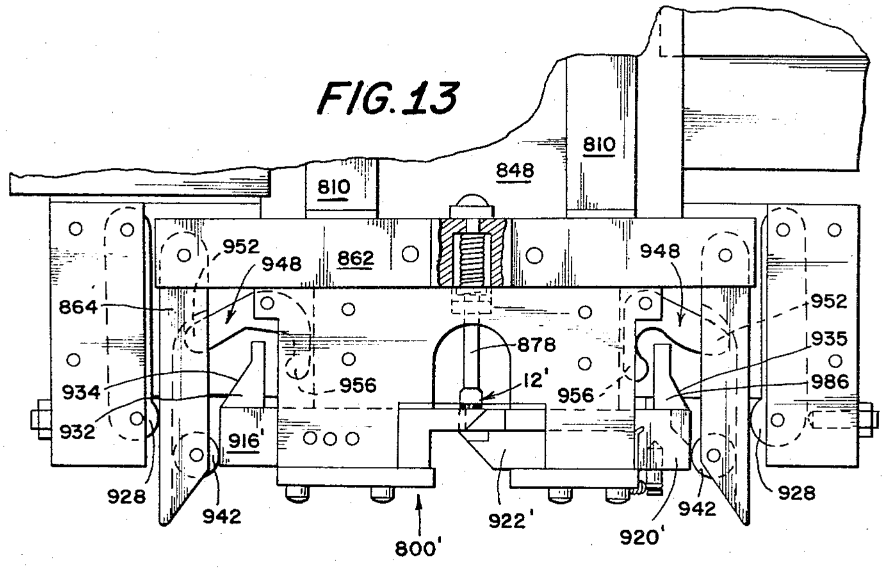
Figure 14:
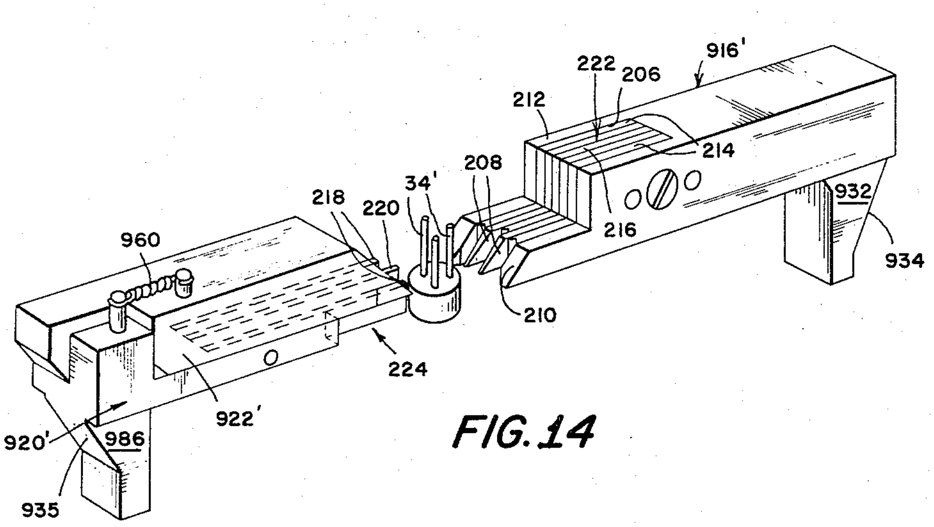

FIG. 3 is a perspective view of a portion of the index wheel carrying an electrical component having a pair of parallel leads extending from a face thereof, and a single lead extending from the opposite face; and a pair of complementary die blocks, each built up of a number of blades, and illustrating the position of the blocks with respect to the component prior to actuation of one of the hydraulic presses for processing the pair of parallel leads;

FIG. 4 is a perspective view of the slide which yieldably carries the electrical component within the index wheel;

FIG. 5 is a perspective view of a pair of complementary die blocks, of the instant invention, each built up of a number of blades, to process the single lead on the far side of the component, as shown in FIG. 3;

FIG. 6 is a magnified partial front elevational view of a pair of rippler blades as used in the ripple die blocks;

FIG. 7 is a magnified partial side elevational view of the pair of rippler blades, as shown in FIG. 6;

FIGS. 8, 9, and 10 illustrate the combing and rippling or straightening of a lead of a component by a pair of dies of the invention;

FIG. 11 illustrates another embodiment of the present invention showing in a side elevational view the lead processing device disclosed in the co-pending application (for Automatic Transistor Insertion Machine, Ser. No. 389,927, filed Aug. 17, 1964, in the names of Daniel W. Ackerman, Gary D. Johnson, and Philip A. Ragard) adapted to comb, and ripple or straighten, three parallel leads extending from the face of an electrical component;

FIG. 12 is a top plan view of the embodiment of FIG. 11;

FIG. 13 is a partial side elevational view of the embodiment of FIG. 12 with the lead ripplers or straighteners in the fully actuated position; and FIG. 14 is a perspective view of a pair of cooperating die blocks of the second embodiment in the deactivated position.

Figure 1:
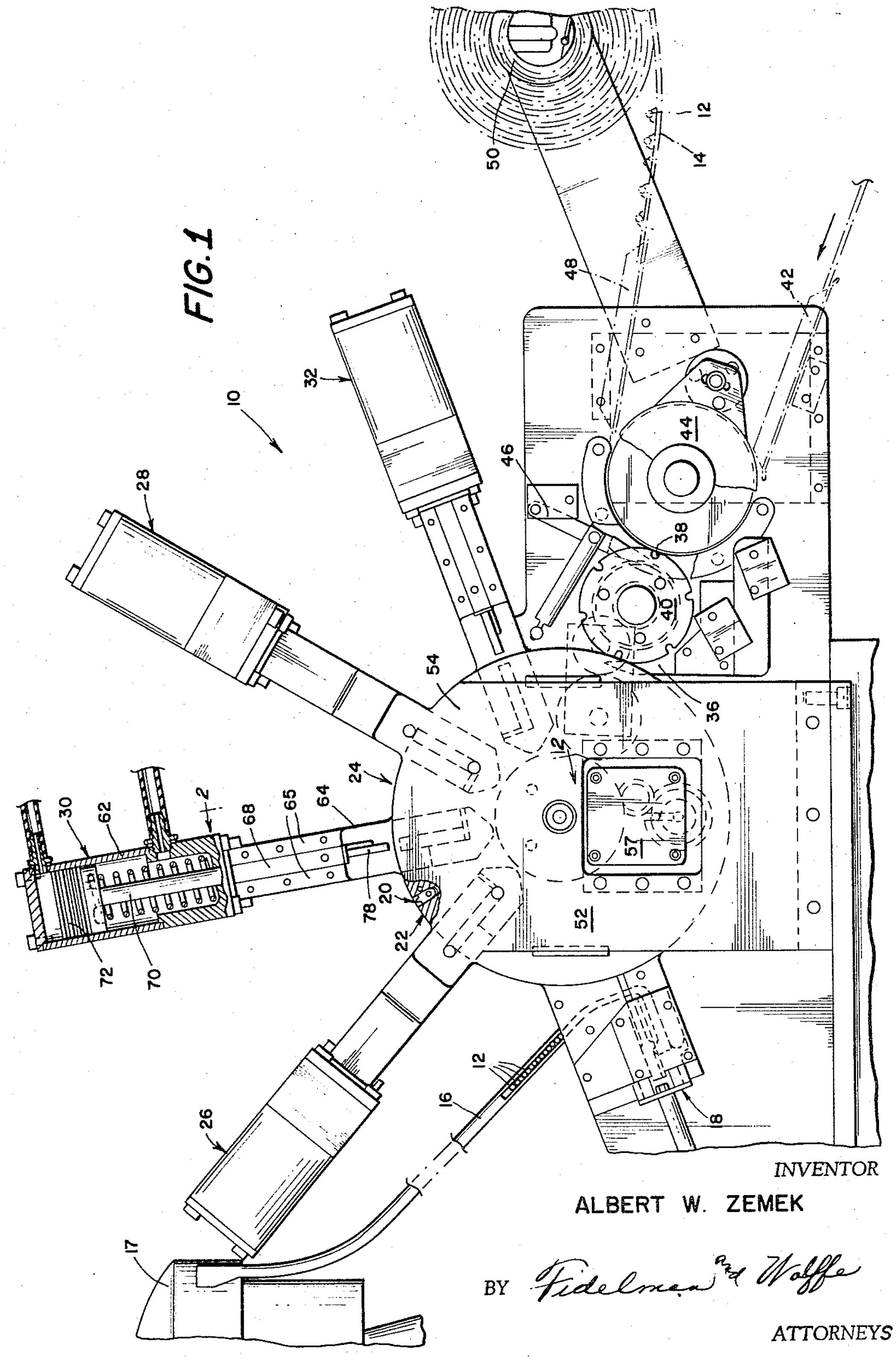
FIG. 1 is a diagrammatic representation, partially in cross section, of a component lead aligning and taping machine designed to handle components having parallel leads extending from one or opposite sides of the body thereof.

The first embodiment of the invention is a machine designed to process transistors, each of which has a pair of parallel leads extending from a first side thereof and a single lead, parallel to the other two, extending from the opposite side. As shown in FIG. 1, the machine, generally designated 10 receives individual transistors, generally designated 12, from a vibratory bowl feed mechanism 17 well known in the art, aligns the three leads thereof and then attaches the transistors 12 to a strip of carrier tape 14. A guide chute 16 conducts the transistors 12 from the feed device 17 to an escapement assembly 18 through which the transistors 12 are fed, one by one, in a timed relationship, to individual holding pockets, generally designated 20, spaced equidistantly along the circumference of a rotatably driven index wheel 22 journalled in a rippling and straightening section 24. The transistors 12 are carried through the rippling and straightening section 24 on the index wheel 22 past rippler presses 26 and 28 and straightening presses 30 and 32 which act to straighten the leads 34 (FIG. 3) thereof so as to remove any tendency for them to bowl or curl. After the lead processing operation the transistors 12 are automatically removed from the pockets 20 in the circumference of the index wheel 22 by the stationary finger 36 which extends into a circumferential groove 37 in the index wheel 22 (FIGS. 2 and 3) and cams the individual transistors into pockets 38 in the circumference of a transfer wheel 40 where it is resiliently gripped and carried around about 180°. A back up roll 44 is journalled in the machine 10 adjacent the transfer wheel 40, on the side opposite the index wheel 22. An empty tape 14 is drawn out from a wind out roll (not shown), and by means of a guide plate 42, is wrapped around the back up roll 44, between the back up roll 44 and the transistor wheel 40. An automatically actuated pusher 46, sequenced with the transfer wheel 40, is pivoted to drive the transistor 12 out of its pocket 38 in the transfer wheel 40 and onto the adhesive face of the tape 14 being carried past on the back up roll 44. The tape 14, now carrying the transistors 12, exists from the back up roll, onto a guide plate 48, and is then coiled up on a wind up reel 50. The invention resides in the lead processing section 24 and particularly in the blade configuration of the dies mounted in the presses 26–32, and thereafter only this section of the machine 10 will be discussed in detail.

The index wheel 22 is positioned between a front support plate 54 and a parallel rear support plate 52 on a hub 56 which is journalled on a shaft 58 extending between the support plates 52, 54. A gear 60 is also concentrically mounted to the hub 56 to rotate the index wheel 22 from an electric motor 57 by an intermediate gear train. Bolted to the inner wall of the front support plate 54 is the rippler press 26 and the straightener press 28 while bolted to the inner wall of the rear support plate 52 is the rippler press 30 and the straightener press 32. The presses 26–32 all face inwardly so that the rippler press 26 and the straightener press 38 can process the double leads 34 extending from the face of the transistor 12 adjacent the rear support plate 52; and the rippler press 30 and the straightener press 32 can process the single lead 34 extending from the face of the transistor 12 adjacent the front support plate 54.

In discussing the structure of the presses, rippler press 30 will be used for illustrative purposes, being identical to the rippler press 26 and the straightener presses 28 and 32 with the single exception of blade configuration. Press 30 consists of an upper fluid motor 62 (shown in cross section in FIG. 1) and a lower, rigidly connected press body 64. The fluid motor 62 has a piston 72 with a depending piston rod 70 extending into the lower press body 64. The press body 64 is generally "C" shaped with the open portion of the "C" facing the index wheel 22 and the rear face of the "C," abutting the front support plate, fixed rigidly thereto by a pair of bolts 66 extending through holes in the support plate 52 and into tapped holes in the "C" shaped press body 64. Slidably held within the upper portion of the press body 64 by a pair of spaced apart guide ways 65 is a vertically reciprocatable plunger 68 which is connected to the lower end of the piston rod 70, fixedly held in the plunger 68, by a pin 75 in a hole 74. The lower end of the plunger 68 depends into the "C" shaped cavity in the press body 64 and has a boss for mounting an upper die block 76 over the double leads of the transistor 12 which is held in the index wheel 22 (FIGS. 2 and 3) adjacent to the die 76, in a position to be acted on by the press 30. Fixedly mounted on a boss on the lower jaw of the "C" of the press body 64 is a lower die block 84 positioned to cooperate with the upper die block 76. Hold down rod 78 is reciprocatable within a vertical passage 80 in the plunger 68 and yieldably positioned downward toward the body 82 of the transistor 12 by a compression spring 81.

As seen in FIG. 3, the upper die block 76 of the rippler press 30 consists of three diagonally faced combing blades 86 and two horizontally faced forming blade 88, each positioned to space apart a pair of adjacent combing blades 86. The diagonal working face 90 of each combing blade 86 is arranged with its lowest depending edge adjacent the index wheel 22 while the horizontal working face 92 of each of the forming blades 88 is positioned, with respect to the combing blades 86, so that the working faces 92 of the forming blades 88 depend approximately to the upper edges of the diagonal working faces 90 of the combing blades 86.

The lower die block 84 is designed to interlock with the upper die block 76, having a pair of horizontally faced forming blades 96, each of which is sandwiched between an adjacent pair of the three diagonally faced combing blades 94. The combing blades 94 are all positioned with the low edge of each diagonal face 95 adjacent the index wheel 22 while the working faces 98 of the forming blades 96 extend upward to the high edge of the combing blades 94.

The pockets 20 in the index wheel, within which the transistors 12 are held during processing, each consists of a radial slot 102 in the surface of the wheel within which slides a yieldable transistor holder 104. The transistor holder 104 is slidably held in the slot 102 against movement perpendicular to the plane of the wheel 22 by a plate 106 fitted into a cutout 110 (FIG. 4) in the holder 104 so as to form flanges extending beyond the sides thereof into auxiliary vertical slots 108 in the pocket slot 102. The transistor holder 104 is biased radially outward by a spring 112 compressed between a blind hole 114 in the lower end of the holder 104 and another blind hole in the bottom of the slot 102. The radial movement of the holder 104 is restricted by a cutout 116 in the plate 106 in combination with a bolt 118 extending through a hole in the index wheel 22 intersecting the cut out in the plate 106.

The outer end of the transistor holder 104 has a substantially semi-circular hollowed out portion 120 shaped to accept the cylindrical body section 82 of the transistor 12. A thin, flat, wall section 127, terminating in a triangular finger 128, is formed in one side face of the holder 104, terminating the hollowed out portion 120 to axially locate the transistor 12 within the portion 120 while radially positioning the parallel leads 34 thereof correctly for the pair of dies 76 and 84. A spring plate 122 is rigidly fixed in the opposite side face of the holder 104 by a bolt 123 threaded into a tapped hole 126 in the holder 104. The spring plate 122 biases the body of the transistor 12 axially in the hollow 120, against the flange 128 while allowing the single lead 34 of the transistor 12 to extend between the bifurcated upper end 124 thereof.

In operation (FIGS. 8–10), when the index wheel 22 stops with a transistor 12 between the die blocks 76 and 84, the transistor 12 is actually between the blocks, touching neither (FIGS. 3 and 8). As the die block 76 moves downward toward the die block 84 the combing blades 86 force their way down, with the center combing blade 86 moving between the pair of leads 34 to separate them, and the outer combing blades 86 moving outside the adjacent leads 34, causing the leads to conform to the vertical paths between each pair of combing blades 86. The diagonal shape of the combing blade 86 permits the blades to first contact the leads 34 at their roots adjacent the transistor body 82 and then to contact the leads 34 further along their lengths as the die block 76 moves down until the entire lengths of the leads 34 are held within the vertical channels between the blades. As the combing blades 86 come in contact with the leads 34, the hold down rod 78 contacts the top of the transistor body 82, driving the transistor 12 down against the spring 112 of the transistor holder 104 to move the transistor 12 inward toward the axis of the index wheel with the pair of parallel leads 34 moving toward the lower die block 84. As the combing blades 86 and 94 come together, the transistor 12 is held tightly by the action of the rod 78 against the transistor body 82, and as the transistor holder 104 bottoms, the yieldably mounted rod 78 moves upward, with respect to the die block 78. As the die blocks 76 and 84 come together the pair of parallel leads 34 are each caught between a pair of cooperating forming blades 88 and 96 which are compressed sharply to act on the leads. Therefore it is seen that in one press actuation, the leads 34 are combed apart then are processed by the forming blades.

In FIG. 5, is shown a pair of die blocks, designed to form a single lead, consisting of an upper die block 130 and a lower die block 132. The single lead upper die block 130 utilizes the identical blades as the double lead upper die block 76, but only requires two combing blades 86 and a single included forming blade 88. The lower single lead die block 132 utilizes the identical blades as the double lead lower die block 84, but also only requires two combing blades 94 and a single included forming blade 96.

So that a lead 34 is not aligned only in one plane, the upper forming blades 88 of the dies 76 and 130 each has a triangular groove 134 (as shown magnified in FIG. 7) extending along the length thereof to cause a three point contact *a*, *b*, *c*, with the planer face 98 of the respective forming blade 96 of the dies 84 and 132 as illustrated. Since the direction of contact, of the forces *b* and *c* would have both horizontal and vertical components, the lead 34 would be effectively acted on in two perpendicular planes.

The difference between the straightening and ripple die blocks lies solely in the contact face configuration of the forming blades. The straightener forming blades 88 and 96 have perfectly flat contact planes, the upper blades 88 being made up of the flat sides of the groove 134. The rippler blades are identical to the straightener blades except that a continuous series of hills and valleys are cut into the contact faces 92 and 98 along the lengths thereof (FIG. 6), hence the name "rippler".

It has been found that if the leads 34 are first formed by a pair of rippler dies, to continuously bend each of the leads into a substantially sinusoidal pattern, and then the lead 34 is acted upon by a pair of planar surfaced straightener dies to remove the pattern, the leads will remain straight and will lose any previous permanent set, the leads no longer tending to bend out of an axial position as with previously designed lead straighteners.

Lead rippling is especially desirable prior to straightening when the component leads are very long. It can be dispensed with, however, in some instances if the leads are extremely short and the spacing therebetween is relatively large.

The second embodiment of the invention, in which transistors, each having three parallel leads, not all in the same plane, are straightened, is incorporated in the transistor straightener of application Ser. No. 389,927 previously cited (shown in FIGS. 2, 4, 8, and 27–37 and described completely on pages 47–58 thereof). A brief description of the operation of the straightener follows to permit the reader to understand, generally, the coaction of parts without referring to the previous application. All substantially identical parts will have the same reference numerals while corresponding but not identical elements which have corresponding numerals primed.

As shown in FIG. 11, a transistor 12′ is driven into the tool holder 812′ past the mounting plate 802 (and is positioned by a meter wheel 892 or escapement blade 1121 as described in application Ser. No. 389,927) as the bar 862 starts to descend under the action of the slave cylinder C–18 and the intermediate slide block 846, which is held by vertical ways 810 on the mounting plate 802. As the bar 862 continues to descend, the damping tip 886 presses down on the top of the body 82′ of the transistor 12′ under the urging of a rod 878 yieldably mounted through the bar 862. The actuating levers 864, backed up by adjustably positioned rollers 928, act on straightening tool 916′, 920′, through their journalled rollers 942 by abutting inclined cam surfaces 934 and 935 on tool heads 932, 986 respectively, to cam the straightening tools inward to mesh together and process the leads of the transistor 12′. As the tools come together the blades thereon interlock forming three composite circular passages through the blades. The passages form the apexes of a triangle and are spaced to match the three transistor leads 16′. A trimming tool 922′, yieldably mounted on the tool 920′ has a cam surface 988′ thereon contacted by the roller 942, after the roller 942 has driven the tool 920 inward, and trimming tool 922′ simultaneously inward to drive the trimming tool 922′ further inward to trim the ends of the leads 34′ (FIG. 13).

As the piston in the slave cylinder C–18 retracts, the bar 862 and the actuating levers 864 move upward. The rollers now each abut an arm 952 of a belt crank 948, rotating the crank 948 to cause a second arm 956 of the crank 948, lying adjacent the inner vertical edge 956 of the respective head 932, 986 to drive the tools 916′, 920′ outwardly, out of mesh, freeing the processed leads 34′ while the trimming tool 922 retracts by the action of a coil spring 960 yieldably connecting the tool 920′ to the trimming tool 922′. The microswitches, numbered 200 and 202 and the switch actuation bar numbered 204 (only in the present application) do not appear in application Ser. No. 389,927 and do not effect the operation of the straightener 800′ as described. These elements are merely shown as part of the environment and do not form a part of the instant invention.

The lead straightening tool 916′ (FIGS. 12 and 13) has a longitudinal rectangular cavity 206 extending back from the portion of the tool 916′ that would intersect the component leads 34′, upon actuation of the straightener 800′ forming diagonally faced tines 212. Within this cavity is a composite die block 222 comprising a number of blades including a pair of combing blades 208 having diagonally shaped working faces, the planes of these faces lying the plane of diagonally cut terminal faces 210 of the tines 212. Between each of the diagonally faced combing blades 208 and the adjacent tine 212 is fixed a processing blade 214 while between the pair of combing blades is another processing blade 216. The processing blades 214 are of equal length while 216 is shorter and does not extend as far toward the component. The process blade lengths are determined by the positioning of the leads of the transistor 12' whose leads 34' are arranged with a single lead 34' between and forward of a pair of leads 34' that are parallel to the composite tool face. The tool 920' has a composite die block 224 affixed to the forward end thereof and made up of a pair of short side process blades 218 and a long center process blade 220 positioned with spacers therebetween (not shown). The blades of the die blocks 222, 224 are so arranged that when the tools 916', 920' move together, the tines 212 and the combing blades 208 will intermesh with the process blades 218 and 220 to comb the leads until the process blades 214, 216 of composite block 222; and 218, 220 of composite block 224 come together with the transistor leads 34' therebetween to ripple or straighten them. Although only one lead straightener 800' is shown in FIGS. 11–14, such units are usually used in pairs, as in the first embodiment, when rippling the leads 34' before straightening them. The processing units 800' are adapted to be mounted on a vertical or horizontal transistor guide channel as shown in the prior application and may be placed in any convenient location in a compartment processing machine. Furthermore these units can be adapted to handle components with more than three heads. For example, with a four lead component (the leads forming a square or other rhombic pattern), an electrical component can still be angularly oriented so that all of the leads are individually processed. However this arrangement requires the use of very thin combing blades to separate the leads and necessitates five combing blades and four forming blades for each die. With more than four leads to be processed it is necessary to provide the rippling and straightening device with a reciprocatable center anvil that moves in between the leads of the component in a direction parallel to the axis of the leads after which a number of dies move inwardly toward the center die and perpendicular to the leads, each forming one or more of the leads.

Although it is usually advantageous to use the forming units of either embodiment in pairs, rippler and straightener, in some cases the straightener unit will be used alone. This is found to be economically advisable if it is used prior to taping, as in the first embodiment, when the tape is designed to be then utilized in an insertion machine having its own rippler-straightener units.

While the foregoing specification illustrates and describes what I now contemplate to be the best mode of carrying out my invention, the construction is, of course, subject to modification without departing from the spirit and scope of my invention. Therefore, I do not desire to restrict the invention to the particular form of construction illustrated and described, but desire to cover all modifications that may fall within the scope of the appended claims.

Having thus described my invention what is claimed is:

1. A machine for straightening at least one wire lead extending from a face of a body portion of an electrical component, said machine comprising first means for impressing a stationary ripple pattern along substantially the entire length of said lead while movement of said lead with respect to said impressing means in a direction lengthwise of said lead is arrested, and second means for straightening said rippled lead to remove the ripple and produce a straight lead with no appreciable tendency to bend.

2. A lead straightening machine as described in claim 1 wherein said first means simultaneously ripples at least three parallel leads extending from said component face, at least one of said leads being non-coplanar with at least two other of said leads.

3. A lead straightening machine as described in claim 1 wherein said first means for rippling said lead extending from said component face comprises a pair of die blocks having complementary ripple patterns on working faces thereof and means for driving said die blocks together, when said lead extending from said component face lies between the die blocks.

4. A lead straightening machine as described in claim 1 wherein at least one wire lead extends from another face of said component body portion and there are rippling means and straightening means positioned to straighten leads extending from said component faces, means for conveying said component through the lead rippling and lead straightening means with said component body portion remaining in the same orientation with respect to said conveyor during the lead rippling and lead straightening of all of said leads.

5. A lead straightening machine as described in claim 1 wherein said ripple pattern comprises at least two standing portions of equal and opposite curvature.

6. A lead straightening machine as described in claim 1 wherein said ripple pattern impressed on said lead comprises at least two standing curved portions, at least two of the curved portions of said lead lying on opposite sides of a line formed by the axis that the lead will have after the straightening operation, when considering the axis line of the straightened component lead as the X axis of a graph, the area of the curve below the axis will equal the area above the axis.

7. A method for straightening deformable wire leads extending from a body portion of an electrical component comprising the following steps:

(1) forming a standing ripple pattern along the length of each of said component leads;

(2) removing the ripple pattern from the leads by compressing each of the leads along at least two lines parallel to the axis of the component lead when straightened.

8. A method for straightening said deformable wire leads of electrical components as described in claim 7 wherein at least two parallel wire leads extending from one face of said component body portion are rippled simultaneously and then straightened simultaneously.

9. A method for straightening a deformable wire lead of an electrical component consisting of the prepatory step of deforming the lead by forming a standing ripple pattern along substantially the entire length thereof while movement of said lead in a lengthwise direction is arrested prior to the straightening step.

10. In a machine for processing electrical components having at least one lead extending from a face of the body of the component, a pair of opposed die blocks having complementary first and second working surfaces, and means for moving said die blocks toward each other to compress said lead therebetween, said first working surfaces of said die blocks being formed to first contact said component lead at a point at which said lead first extends from said component body and to progressively constrain more of said lead along the length thereof until the entire length of said lead is constrained within a single plane, and said second working surfaces applying compressive forces to said lead along the length thereof to permanently set said lead into a desired shape and in a predetermined position with respect to said component body.

11. In a machine for processing electrical components having at least one lead extending from a face of the body of the component, a pair of opposed die blocks having complementary first and second working surfaces, and means for moving said die blocks toward each other to compress said lead therebetween, said first working surfaces of said die blocks combing said lead into a single plane, and said second working surfaces applying compressive forces to said lead along three continuous lines of contact extending lengthwise of said lead to permanently set said lead in a designed shape and in a predetermined position with respect to said component body.

12. The electrical component processing machine recited in claim 11, wherein said second working surfaces of said die blocks are formed to deform the lead into a standing ripple pattern.

13. An electrical component processing machine as recited in claim 10 wherein the second working surfaces of said pair of dies are formed to deform the lead into a standing ripple pattern.

14. The electrical component processing machine recited in claim 11 wherein the second working surface of one of said dies is "V" shaped when viewed through any plane perpendicular to the axis of the lead as straightened.

15. The electrical component processing machine recited in claim 10 wherein there are at least three leads, not all in the same plane, extending from said face of said component body, and said first and second working surfaces of said die blocks being adapted to simultaneously constrain and shape all of said leads extending from said face.

16. A die block for use in combing and shaping the leads of electrical components, said die block comprising at least two combing blades and a lead forming blade rigidly fixed between each pair of combing blades, said combing blades extending outward of the forming blades, each combing blade having a diagonally shaped working surface whereby, when the die is correctly mounted in a lead straightening machine, only a portion of each lead is constrained by a pair of combing blades when the blades first contact the lead and substantially the entire lead is constrained when the forming blades shape the component lead.

17. A die block according to claim 16, wherein said lead forming blade is provided with a lead forming surface having a continuous series of hills and valleys extending transversely between said pair of combing blades.

18. A machine for straightening at least one deformable wire lead extending from a face of an electrical component, said machine comprising a means for first aligning said lead into a single plane and then impressing a standing ripple pattern on said lead along the length thereof and means for aligning said rippled lead into a single plane and then straightening said rippled lead to remove the ripple whereby a straight lead with no appreciable tendency to bend is produced.

19. A lead straightening machine as recited in claim 18 wherein there is a means for conveying said component through said lead rippling and straightening means including yieldable means for centering each of said components in said rippling means when said pattern is impressed on said leads and in said straightening means when said lead is straightened.

References Cited

UNITED STATES PATENTS

| | | | |
|---|---|---|---|
| 1,917,624 | 8/1930 | Webb | 140—147 |
| 3,028,886 | 4/1962 | Drukker | 140—147 |
| 3,079,958 | 3/1963 | Helda | 140—147 |
| 3,144,889 | 8/1964 | Cole | 140—147 |
| 3,106,945 | 10/1963 | Wright et al. | 140—147 |
| 3,219,068 | 11/1965 | Strohl | 140—147 |
| 3,225,797 | 12/1965 | Stoody | 140—147 |

CHARLES W. LANHAM, *Primary Examiner.*

E. M. COMBS, *Assistant Examiner.*